(12) United States Patent
Kamperman et al.

(10) Patent No.: US 7,334,129 B1
(45) Date of Patent: Feb. 19, 2008

(54) EMBEDDING SUPPLEMENTAL DATA IN AN ENCODED SIGNAL

(75) Inventors: Franciscus L. A. J. Kamperman, Eindhoven (NL); Alphons A. M. L. Bruekers, Eindhoven (NL); Renatus J. Van Der Vleuten, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/623,945

(22) PCT Filed: Jan. 10, 2000

(86) PCT No.: PCT/EP00/00217

§ 371 (c)(1),
(2), (4) Date: Sep. 12, 2000

(87) PCT Pub. No.: WO00/42770

PCT Pub. Date: Jul. 20, 2000

(30) Foreign Application Priority Data

Jan. 13, 1999 (EP) .................................. 99100580

(51) Int. Cl.
*H04L 9/00* (2006.01)
(52) U.S. Cl. ....................................... 713/176; 380/202
(58) Field of Classification Search ........ 380/200–202; 713/176
See application file for complete search history.

(56) References Cited

U.S. PATENT DOCUMENTS 5,748,763 A * 5/1998 Rhoads ....................... 382/115
5,809,139 A * 9/1998 Girod et al. ................. 380/202
5,889,868 A * 3/1999 Moskowitz et al. ........ 713/176
5,930,369 A * 7/1999 Cox et al. ..................... 380/54
6,037,984 A * 3/2000 Isnardi et al. ........... 375/240.21

(Continued)

FOREIGN PATENT DOCUMENTS

WO    WO 97/13248 A1 *  4/1997

OTHER PUBLICATIONS

"Lossless Coding of 1-Bit Audio Signals", by Fons Bruekers et al, Audio Engineering Society, 103rd Convention 1997, Sep. 26-29, 1997, New York, 4563 (1-6).

*Primary Examiner*—Gilberto Barron, Jr.
*Assistant Examiner*—Jung Kim
(74) *Attorney, Agent, or Firm*—Michael E. Belk

(57) ABSTRACT

There are two different methods of embedding supplemental data, e.g. for watermarking into an encoded signal.

Figure 1:
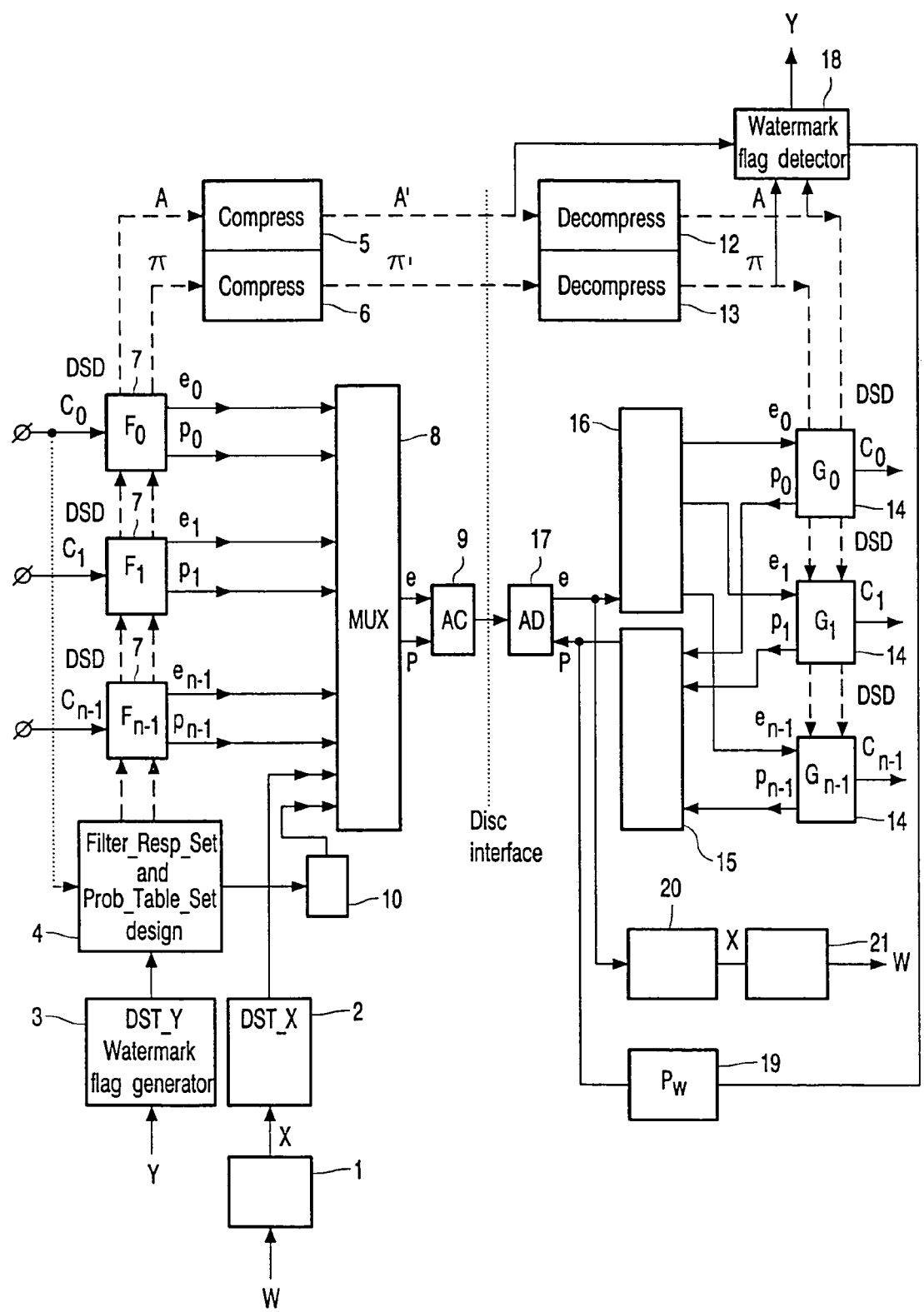

I. For an encoder, which needs auxiliary information for encoding (=probability information in this special case), the auxiliary information to encode the supplemental data is derived from data used otherwise in the encoding process. The advantage is that the derived auxiliary data does not have to be stored, so that embedding the supplemental data is economical with respect to the total amount of bits used.

II. In the encoding process used for super Audio CD, a set of parameters (e.g. filter coefficients) is used by the encoder, whereby these parameters have to be stored, as they are needed for decoding. To embed supplemental data, at least one of the chosen parameters (e.g. the LSB of the first coefficient) is set to a dedicated value in response to the value of the supplemental data to be embedded. The advantage is that the bit rate will not be affected at all.

21 Claims, 2 Drawing Sheets

U.S. PATENT DOCUMENTS

| | | | |
|---|---|---|---|
| 6,122,379 A * | 9/2000 | Barbir | 380/269 |
| 6,192,138 B1 * | 2/2001 | Yamadaji | 382/100 |
| 6,275,599 B1 * | 8/2001 | Adler et al. | 382/100 |
| 6,285,775 B1 * | 9/2001 | Wu et al. | 382/100 |
| 6,332,194 B1 * | 12/2001 | Bloom et al. | 713/176 |
| 6,885,749 B1 * | 4/2005 | Chang et al. | 380/269 |

* cited by examiner

EMBEDDING SUPPLEMENTAL DATA IN AN ENCODED SIGNAL

The invention relates to an arrangement for and a method of embedding supplemental data in an encoded signal.

There is a growing need to accommodate supplemental data in encoded data, such as encoded audio and video signals, preferably without increasing the data rate. Especially if the supplemental data is used as watermarks, it should be added in a perceptually invisible manner. Watermarks may comprise information, for example, about the source or copyright status of documents and audio-visual programs. They can be used to provide legal proof of the copyright owner, and allow tracing of piracy and support the protection of intellectual property.

The Super Audio Compact Disc (SACD) format, for example, specifies lossless coding (LLC) to allow about twice as many data effectively on the disc. The lossless coder is required to allow a playing time of up to 74 minutes of multi-channel audio in SACD quality. As the words "lossless coding" point out, the required storage capacity of any data is reduced in such a way that, after decoding, the original signal is reproduced bit-identically. Such an encoder/decoder is described, for instance, in Improved Lossless Coding of 1-Bit Audio Signals, by Fons Bruekers, Werner Oomen, Rene van der Vleuten, Leon van de Kerkhof, Audio Engineering Society, $103^{rd}$ Convention 1997, September 26-29, New York, 4563 (I-6). Encoding is performed by partitioning an input data stream into frames and determining a set of optimized parameters for each frame. Part of these parameters issued for prediction to remove redundancies. The difference between the original signal and the prediction signal, which is referred to as residual signal, comprises much less relevant information, if good prediction parameters can be found. As lossless coding is envisaged, the residual signal cannot be omitted, but if it comprises less relevant information, it can be entropy-encoded very efficiently, using some other part of the optimized parameters. As the redundant information is held in the parameter set, the parameter set as well as the entropy-encoded residual signal are stored and needed for lossless decoding.

If supplemental information is needed, for instance for purposes of watermarking, it may be added—as is fairly widely known—by adding it to the original signal in such a way that the signal amendment will not be noticed by a listener. A signal altered like this can no longer be considered as a (bit true) original signal. Additionally, this kind of watermarking suffers from the fact that it is not possible to detect watermarks present in the encoded signal without lossless decoding. For reasons of simplicity of the watermark decoder, it is desirable to have the option to detect watermarks prior to lossless decoding.

It is an object of the invention to provide an arrangement for and a method of embedding supplemental data in an encoded data signal, which allows the embedded supplemental data to be read without decoding the whole signal and does not influence music quality.

To this end, a method according to the invention is characterized in that, for embedding supplemental data, the supplemental information is inserted into the data, and the auxiliary information needed to encode the supplemental data is derived from other data available in the encoding process.

The advantage of the invention is that, by inserting the data into the data to be encoded, the supplemental information cannot be removed without disturbing the content of the encoded signal. As the auxiliary information needed to encode the supplemental information is derived from other data available in the encoding process, the auxiliary information to encode the supplemental data does not need to be recorded or stored for a later decoding process. Thus, this method is very economical with respect to the bit rate.

It is another object of the invention to provide an alternative to the first solution.

To this end, a further method according to the invention is characterized in that, for embedding supplemental data into the encoded signal, the parameter set is affected by the supplemental data. Thus, not all of the complete data has to be decoded to read a watermark, but only the part of the data where the parameters used for encoding/decoding are contained. As the supplemental information is embedded in the parameter set, no additional bit has to be spent for this information.

The supplemental information may be embedded by choosing an even or odd number of parameters or by changing the least significant bit of e.g. the first parameter. As an example, an even number of parameters represents the value '1' of a watermark bit; an odd number of parameters represents the value '0' of a watermark bit.

The invention benefits from the fact that, for practical reasons (computation power, costs, . . . ), not the best set of parameters but a reasonably good set of parameters is determined for encoding. Therefore, these algorithms have been designed to work with a sub-optimal set of parameters as a rule. Small changes in the parameter set, like changing the least significant bit of a parameter, adding a dummy parameter in order to achieve an odd or even number of parameters, whatever is needed to embed a watermark bit or even omit a parameter in order to achieve the odd or even number of parameters, will thus normally have no huge impact on the encoding efficiency. Sometimes, such a small variation of the parameter set may even marginally improve the encoding process.

An advantage of the invention is that, if the data should be kept in lossless coded form, the watermarks cannot be removed without decoding the signal and repeated lossless encoding of the data with an altered set of parameters. As the lossless decoder requires all coefficients, a missing or incorrect coefficient, which has been removed or changed to delete the watermark, will result in a signal loss for the duration of a frame for all channels.

FIG. 1 shows an arrangement for embedding two independent supplemental data x, y into a lossless coded signal. First data x are used to embed watermark information w. As the length of the watermark w is longer than the information that could be stored by the supplemental data, the watermark w is packaged by a package generator 1 to a transport packet, which allows embedding of the bits of the data package like a serial signal. By means of a synchronization pattern included in the header of the transport packet, the beginning of the transport packet can be retrieved easily. The bits x of the transport packet are embedded bit by bit to the lossless coded signal as so-called DST_X_Bits.

Second data y is embedded by so-called DST_Y_Bits. An embedded DST_Y_Bit is set to the value '1' to indicate that the lossless coded signal applies to the up-to-date format. If there is any future need to have a flag, the DST_Y_Bit may be used. It should be obvious to those skilled in the art that the DST_Y_Bit in other recording systems may also be used in the form of a structured data stream to embed information which is longer than a single bit.

In order to encode n parallel data streams, which are referred to as data channels $C_0 \ldots C_{n-1}$, the stereo or multi-channel DSD recordings are partitioned into frames.

In the embodiment of the invention, seventy-five frames per second are used for each channel $C_i$. Although the data rate of the watermark signal w depends on the frame rate, the invention is not limited to a special frame rate.

For each frame, a control arrangement, which is not shown as it is not part of the invention, discriminates which mode is used for coding: LLC Plain mode or LLC Coded mode. The LLC Plain mode is used in exceptional cases if the compression ratio of a frame is insufficient, and actually contains plain DSD.

The chosen LLC algorithm is based on a prediction filter and a probability table. The parameter control unit 4 calculates, for each channel $C_i$, a set of prediction filter coefficients $A_i=a_i(1) \ldots a_i(k_i)$ for each prediction filter and a set of probability table coefficients $n_i=n_i(1) \ldots n(m_i)$ for each probability table. In the embodiment of the invention, the length of a prediction filter coefficient $a_i$, is nine bits, whereas the number $k_i$ of prediction filter coefficients is variable, but is limited to a maximum value of 128. Each probability table coefficient $n_i$ has a length of seven bits. The number $m_i$ of the probability table coefficients $n_i$ is also variable, but is limited by a maximum value of sixty-four. Typically, it is between thirty-two and sixty-four. These numbers are given as examples and represent the numbers which have been found to give the best results for audio signals, but should not be interpreted as limiting the invention to these numbers. The numbers of course depend on the frame rate, the prediction filter algorithm and the content of the source signal. However, other numbers allowing a better compression ratio might be found.

Determining optimal coefficients a, $\pi$ is difficult and requires considerable computing power. Therefore, a compromise is made to select just a reasonably good set of coefficients. As a separate coefficient set $A_i$, $\Pi_i$ s calculated for each channel $C_i$, the coefficient sets used for each channel will differ from each other, but do not need to differ in every case.

To insert a DST_Y_Bit into a frame, a flag generator 3 alters the least significant bit LSB of the first filter coefficient $a_0(1)$. As already mentioned before, no substantial decrease in encoding performance should be realized by slightly altering the filter coefficients.

All coefficients of the sets A and $\Pi$, including the modified coefficient $a_0(1)$, are substantial for the encoded signal and must thus be recorded for a later reading or decoding process. As all coefficient sets A as well as $\Pi$ still have some redundancy, a first and a second compressor 5, 6 are used to generate compressed data words A', $\Pi'$. Preferably, a compression algorithm is used, which will allow the corresponding decompression of A' and $\Pi'$ in a most easy way, so that reading the embedded DST_Y_Bit could be done without great effort.

Figure 2:
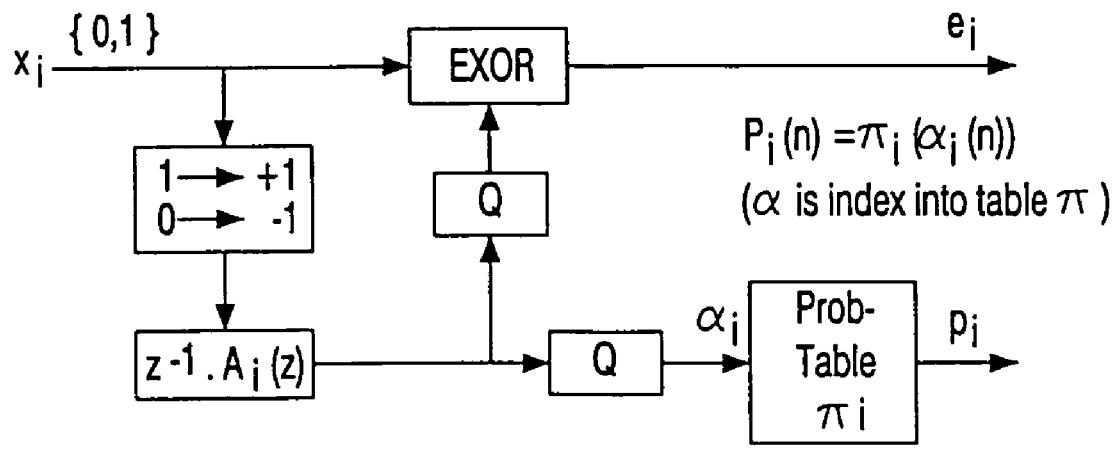

It is important that the coefficients, the values of which have been modified, are also used for the lossless encoding instead of the original evaluated coefficients. Otherwise, the decoding process will fail. In this embodiment of the invention, the function of the lossless encoder is split up into an encoding prediction unit 7 for each channel $C_i$ and an arithmetic encoder 9 which is common to all encoding prediction units 7. The structure of an encoding prediction unit 7 is shown in FIG. 2.

An encoding prediction unit 7 comprises a prediction filter 71 which is initialized with the corresponding filter parameter set $A_i$. By means of a level converter 72, a binary '0' of the input signal $x_i$ is converted into the numerical value '−1' and a binary value '1' is converted into the numerical value '+1' prior to inputting the input signal to the prediction filter 71. The output signal of the prediction filter 71 is quantized by a first and a second quantizer 73, 74. The output signal of the first quantizer 73 is ex-ored with the input signal $x_i$ by means of an EXOR gate 75 and forms the residual signal $e_i$, which is the first of two output signals of the encoding prediction unit 7. The output signal of the second quantizer 74 serves as an index $\alpha_i$ for a probability table stored in an array 76. The probability table consists of the probability parameter set $\Pi_i$. The output signal of the array 76 forms the second output signal of the encoding prediction unit 7, the probability signal $p_i$. The usage of the probability table is described in greater detail in the paper cited in the opening paragraph.

A multiplexer 8 merges the residual signals $e_0 \ldots e_{n-1}$ into e and the probability signals $p_0 \ldots p_{n-1}$ into p. The output of the watermark generator 2 is also fed to one input of the multiplexer 8. To embed the DST_X_Bits of the watermark information, the multiplexer 8 inserts the DST_X_Bit in front of e. Due to the design of the arithmetic coder 9, a probability coefficient to code the DST_X_Bit, hereinafter referred to as the watermark probability coefficient $p_w$, is indispensable. To save storage space in the embodiment of the invention, the watermark probability coefficient $p_w$ is derived from the first prediction filter coefficient $a_0(1)$. To this end, the first prediction filter coefficient $a_0(1)$ of the first channel is fed to a watermark probability module 10. By means of this module, the first seven bits of the coefficient $a_0(1)$ are interpreted in reverse order as an unsigned integral number D to which the value 1 is added. By using a derived value for the watermark probability coefficient, a recording of the watermark probability coefficient is not necessary and requires no supplemental bit in the encoded data block. In this way, embedding the DST_X_Bit will lengthen the coded LLC block only marginally.

The arithmetic coder 9 generates the Coded DSD signal from the signal e and the probability signal p.

As the DST_X_Bit is inserted as the first bit of each block to be coded by the arithmetic coder 9, the DST_X_Bit may not be located as a single bit in the Coded DSD signal. Therefore, it cannot be removed without decoding the Coded DSD signal. Deleting or changing one or some bits will inevitably cause a loss of data of the whole frame. On the other hand, a rudimentary arithmetic decoder is sufficient for reading a watermark. Hence it meets the ideal of a watermark in a perfect manner: difficult to remove but easy to read. However, it is not mandatory to insert the DST_X_Bit in front of the signal e, but it will slightly simplify the decoding process of the watermark, as only the beginning of the Coded DSD signal has to be evaluated.

The following table shows the rough syntax of a frame coded in the LLC Coded Mode:

| LLC bit | CNTRL | A' | $\Pi'$ | CODED DSD |
| --- | --- | --- | --- | --- |

In this case, the bit LLC has the value '1' to indicate an LLC Coded mode data block. The bits of the CNTRL sub-block contain some control information such as, for example, the number $k_i$ of prediction filter coefficients and the number $m_i$ of probability coefficients of a given channel $Ch_i$. The next two sub blocks A' and $\Pi'$ contain the sets of the prediction filter coefficients A and the probability coefficients $\Pi$ in compressed form. The last block CODED DSD finally contains the coded DSD signal. As explained hereinbefore, the length of the data blocks A, P and CODED DSD varies from frame to frame.

The LLC Coded data blocks are written onto a data carrier such as, for example, a SACD or a DVD. As the process of writing onto the data carrier and the process of reading from the data carrier are not part of the invention, but a lot of appropriate means are known to those skilled in the art, this is not described herein but symbolized by the dashed line 11 and referred to as disk interface.

In the reading device, here in the embodiment of the invention, for example, a SACD or a DVD disc player, a data block is detected as being an LLC Coded block if the first bit, the LLC-B it, has the value '1'. In this case, the data block is divided into its sub-blocks A', Π' and CODED DSD by means of the data contained in the control data block CNTRL. The sub blocks A' and Π' are decompressed by a first and a second decompressor 12, 13 to regain the coefficient sets $A_i$, $\Pi_i$. For each channel a separate decoding prediction unit 14 is provided, each decoding prediction unit 14 comprising a prediction filter and a probability table. At the beginning of decoding an LLC encoded block, the coefficient sets $A_i$, $\Pi_i$ are loaded to the appropriate prediction filters and probability tables of the decoding prediction units 14.

The decoding prediction units 14 also reconstruct the probability signals $p_0 \ldots p_{n-1}$, which are combined to the signal p by a multiplexer 15 of the reading device. The signal p is fed to an arithmetic decoder 16 which, by means of the probability signal p, decompresses the data contained in the sub-block CODED DSD to a data stream e. By means of a demultiplexer 17, the data stream e is split into the different residual signals $e_0 \ldots e_{n-1}$ of the individual channels and fed to the decoding prediction units 14.

Figure 3:
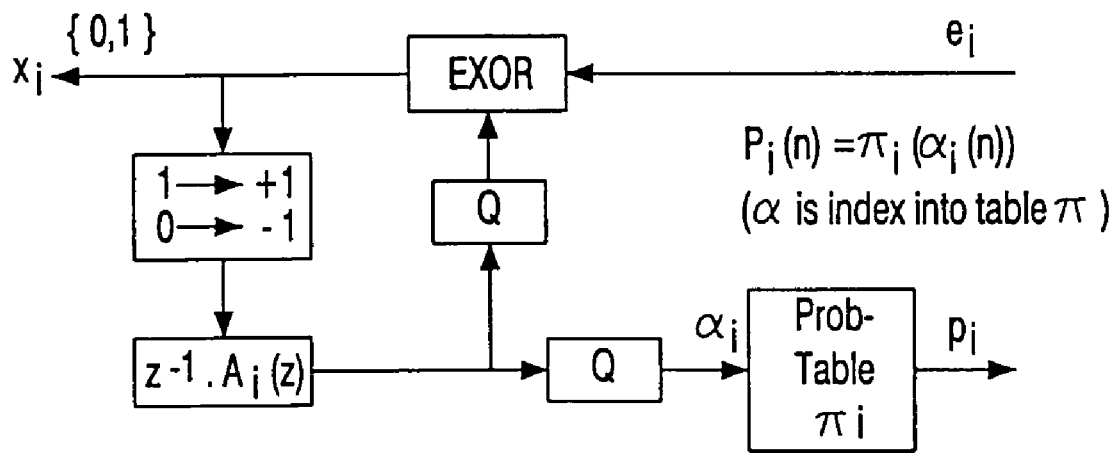

The structure of a decoding prediction unit 14 is shown in FIG. 3. The residual signal $e_i$ of each channel is fed to a first input of an EXOR gate of the decoding sub-unit. The output of the EXOR gate forms the output signal of each channel $Ch_i$. The output signal is also fed to a level converter, which performs the same operation as the level converter in the recording device described hereinbefore. The output of the level converter is fed to the prediction filter. The output of the filter is fed to two quantizers. The output of the first quantizer is connected with the second input of the EXOR gate, the other output of the quantizer is used as an index $\alpha_i$ for the probability table stored in an array. The values $p_i$ of all that is selected by the index $\alpha_i$ are fed via the multiplexer to the arithmetic decoder.

A flag detector 18 is used to reconstruct the embedded DST_Y_Bits. As the DST_Y_Bit is stored in the first coefficient, only the beginning of the compressed A' block has to be examined by the flag detector 18. The flag detector 18 decompresses only the beginning of the A' block and picks out the first filter coefficients $a_0(1)$ of the first channel and analyzes its least significant bits to decide the value of the DST_Y_Bit. As the compressing algorithm for the A and Π blocks was chosen to allow easy decompression, the watermark detector may be designed very primitively as compared to the total decoder.

To extract the watermark w, the coefficient $a_0(1)$ determined by the watermark flag detector 18 is fed to a watermark probability module 19 of the reading device. The watermark probability module calculates, as described for the recording device, the watermark probability coefficient $p_w$. The watermark probability coefficient $p_w$ is fed to the arithmetic decoder to decode the DST_X_Bit. As the DST_X_Bit is the first bit outputted by the arithmetic decoder, it can easily be extracted by a watermark detector 20. However, with a more sophisticated detector, it may be extracted anywhere from the signal, wherever it has been decided to insert it. A formatter 21 extracts the watermark information w from the DST_X_Bits, which are reconverted from a serial bit stream to a data block with the help of the synchronization pattern.

Although the watermark detection function may be integrated in the other decoding means of the reading device, this structure shows that a watermark detection may be done in a stand-alone situation. There is no need to decode the whole coded DSD signal. Therefore, the watermark flag detector 18, the watermark probability module 19, the watermark detector 20 and the formatter 21 may also be integrated in a device of its own and run without the more complicated functions incorporated in the decoding prediction units 14.

The LLC Coded mode has hitherto been described. As described above, if sometimes encoding fails to reduce the bit rate, the signal can just be stored as plain DSD. This data mode is referred to as LLC Plain mode and shown below:

| LLC Bit | DTS_X_Bit | Plain DSD |
| --- | --- | --- |

The LLC bit is set to the value of '0' to indicate that the frame contains Plain DSD. The bit following the LLC Bit is used to store the DTS_X_Bit of the watermark in plain format. The DTS_X_Bit is followed by the Plain DSD data. This ensures that every coded block contains a DTS_X_Bit, regardless of whether it is a Coded DSD or a Plain DSD block. This has the advantage that the serial data stream of the DST_X_Bits does not depend on the format that is used. On the other hand, it is true that the plain DTS_X_bit of a Plain DSD may be changed without doing any harm to the signal content of a block in Plain DSD. However, as a Plain DSD block is the exception in the great majority, there will be more than enough uninterrupted Coded DSD blocks to carry the watermark in full length.

In a further embodiment of the invention, more than one supplemental bit is embedded into the lossless coded signal by changing more than one LSB of the parameters. To embed two bits per frame, for instance, the first and the second prediction filter coefficient $a_1(0)$, $a_2(0)$ of the first audio channel are unused. These two bits may be used to represent the following information:

| LSB $a_0(1)$ | LSB $a_0(2)$ | Meaning |
| --- | --- | --- |
| 0 | 0 | Watermark bit '0' |
| 0 | 1 | Watermark bit '1' |
| 1 | 0 | Synchronization symbol |
| 1 | 1 | Reserved for future use |

As only one watermark bit is provided for use in each frame, the watermark information has to be written in a serial data format. Therefore, the synchronization symbol '10' serves to detect the beginning of the watermark information.

The invention claimed is:
1. A method of encoding data, comprising the acts of:
recoverably embedding supplemental data by inserting the supplemental data into encoded data using at least one parameter which is altered in order to embed the supplemental data;

deriving the at least one parameter from the data prior to encoding; and encoding the data, the recoverably embedded supplemental data, and the altered at least one parameter, wherein the data is encoded using an algorithm that is determined by the altered at least one parameter, and wherein the recoverably embedded supplemental data is configured to be detected regardless of whether the remaining encoded data is decoded.

2. A method of extracting supplemental data of encoded data as claimed in claim 1.

3. A method of encoding input data, comprising the acts of:

partitioning the data into frames;

determining a set of parameters for each frame;

reducing the data rate of the input signal by applying an algorithm determined by an affected parameter set whereby encoded data includes one of the set of parameters and at least data which can be used to derive the set of parameters, the data rate-reduced signal, and recoverably embedded supplemental data, wherein the set of parameters is affected by the supplemental data, and wherein the recoverably embedded supplemental data is configured to be detected regardless of whether the remaining encoded data is decoded.

4. A method of extracting information which is embedded in the parameter set of an encoded signal as claimed in claim 3.

5. A method of encoding supplemental data of encoded data as claimed in claim 1, wherein lossless encoding is used to encode the supplemental data.

6. A method of encoding supplemental data of encoded data as claimed in claim 1, wherein the supplemental data is encoded bit by bit.

7. A method of encoding supplemental data of encoded data as claimed in claim 1, wherein before the embedding, partitioning of the data into frames and determining a set of parameters for each frame, wherein the set of parameters can be altered to embed the supplemental data.

8. A method of encoding supplemental data of encoded data as claimed in claim 7, wherein encoded data is used to derive the set of parameters.

9. A method of encoding supplemental data of encoded data as claimed in claim 1, wherein the parameters are altered to a dedicated value in response to the supplemental data to be embedded.

10. A method of encoding data, comprising the acts of:

analyzing data to determine a parameter;

altering the parameter utilizing supplemental data; and encoding the data, the supplemental data and the altered parameter to derive the encoded data, wherein the encoded data is encoded by an algorithm determined by the altered parameter, wherein the supplemental data is recoverable from the encoded data, and wherein the supplemental data is configured to be detected regardless of whether the remaining encoded data is decoded.

11. An encoder comprising:

a portion configured to recoverably embed supplemental data by inserting the supplemental data into encoded data using at least one parameter which is altered in order to embed the supplemental data;

a portion configured to derive the at least one parameter from the data prior to encoding; and a portion configured to encode the data, the recoverably embedded supplemental data, and the altered at least one parameter, wherein the data is encoded using an algorithm that is determined by the altered at least one parameter, and wherein the recoverably embedded supplemental data is configured to be detected regardless of whether the remaining encoded data is decoded.

12. A decoder configured to extract information which is embedded in the at least one parameter of a signal encoded by the encoder as claimed in claim 11.

13. An encoder comprising:

a portion configured to partition data into frames;

a portion configured to determine a set of parameters for each frame;

a portion configured to reduce the data rate of the input signal by applying an algorithm determined by an affected parameter set whereby encoded data includes one of the set of parameters and at least data which can be used to derive the set of parameters, the data rate-reduced signal, and recoverably embedded supplemental data, wherein the set of parameters is affected by the supplemental data, and wherein the recoverably embedded supplemental data is configured to be detected regardless of whether the remaining encoded data is decoded.

14. A decoder configured to extract information which is embedded in the set of parameters of a signal encoded by the encoder as claimed in claim 13.

15. A playback device comprising the decoder as claimed in claim 12.

16. A playback device comprising the decoder as claimed in claim 14.

17. A playback device comprising the encoder as claimed in claim 11.

18. The playback device of claim 17, comprising a disc player for at least one of audio and audio-visual media.

19. The playback device of claim 15, comprising a disc player for at least one of audio and audio-visual media.

20. A playback device comprising the encoder as claimed in claim 13, the playback device comprising a Disc player configured to play at least one of audio and audio-visual media.

21. The playback device of claim 16, comprising a Disc player for audio and audio-visual media.

* * * * *